（12） United States Patent
Chen et al.

(10) Patent No.: US 12,402,414 B2
(45) Date of Patent: Aug. 26, 2025

(54) CAPACITOR AND INDUCTOR EMBEDDED STRUCTURE AND MANUFACTURING METHOD THEREFOR, AND SUBSTRATE

(71) Applicant: Zhuhai ACCESS Semiconductor Co., Ltd., Guangdong (CN)

(72) Inventors: Xianming Chen, Guangdong (CN); Lei Feng, Guangdong (CN); Weiyuan Yang, Guangdong (CN); Benxia Huang, Guangdong (CN); Yejie Hong, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 472 days.

(21) Appl. No.: 17/998,159

(22) PCT Filed: Jul. 24, 2020

(86) PCT No.: PCT/CN2020/104570
§ 371 (c)(1),
(2) Date: Nov. 8, 2022

(87) PCT Pub. No.: WO2021/253572
PCT Pub. Date: Dec. 23, 2021

(65) Prior Publication Data
US 2023/0197739 A1  Jun. 22, 2023

(30) Foreign Application Priority Data

Jun. 17, 2020  (CN) .......................... 202010553554.X

(51) Int. Cl.
*H10D 86/80* (2025.01)
*H10D 1/20* (2025.01)
*H10D 1/68* (2025.01)

(52) U.S. Cl.
CPC ............... *H10D 86/80* (2025.01); *H10D 1/20* (2025.01); *H10D 1/68* (2025.01)

(58) Field of Classification Search
CPC ............. H10D 86/80; H10D 1/68; H10D 1/20
See application file for complete search history.

(56) References Cited

U.S. PATENT DOCUMENTS 8,350,358 B2    1/2013   Kim et al.
2014/0084391 A1 3/2014   Lenive et al.

FOREIGN PATENT DOCUMENTS

CN    1605113 A    4/2005
CN    1753164 A    3/2006
(Continued)

OTHER PUBLICATIONS

International Search Report and Written Opinion for PCT/CN2020/104570 mailed Mar. 1, 2021.
(Continued)

*Primary Examiner* — Richard A Booth
(74) *Attorney, Agent, or Firm* — Buchalter; Jason W. Croft

(57) ABSTRACT

A capacitor and inductor embedded structure and a manufacturing method therefor, and a substrate are disclosed. The method includes: providing a metal plate; sequentially depositing and etching a first protective layer, a thin film dielectric layer, a second protective layer, and an upper electrode layer on an upper surface of the metal plate to form a thin film capacitor and a capacitor upper electrode; pressing an upper dielectric layer to the upper surface of the metal plate, covering the thin film capacitor and the capacitor upper electrode, and etching the metal plate to form a capacitor lower electrode; pressing a lower dielectric layer to a lower surface of the metal plate, and performing drilling on the upper dielectric layer and the lower dielectric layer to form inductor through holes and capacitor electrode through (Continued)

holes; electroplating metal to form an inductor and circuit layers.

12 Claims, 7 Drawing Sheets

(56) References Cited

FOREIGN PATENT DOCUMENTS

| | | |
|---|---|---|
| CN | 1937123 A | 3/2007 |
| CN | 1953169 A | 4/2007 |
| CN | 1988083 A | 6/2007 |
| CN | 102385985 A | 3/2012 |
| CN | 106030782 A | 10/2016 |
| CN | 106663670 A | 5/2017 |
| CN | 109659239 A | 4/2019 |
| IN | 101699587 A | 4/2010 |

OTHER PUBLICATIONS

First Office Action and Search in CN202010553554X mailed Mar. 3, 2021.
Second Office Action and Search in CN202010553554X mailed Jun. 10, 2021.

CAPACITOR AND INDUCTOR EMBEDDED STRUCTURE AND MANUFACTURING METHOD THEREFOR, AND SUBSTRATE

CROSS-REFERENCE TO RELATED APPLICATIONS

This application is a national stage filing under 35 U.S.C. § 371 of international application number PCT/CN2020/104570, filed Jul. 24, 2020, which claims priority to Chinese patent application No. 202010553554.X filed Jun. 17, 2020. The contents of these applications are incorporated herein by reference in their entirety.

TECHNICAL FIELD

The disclosure relates to the technical field of semiconductor packaging, and particularly to a capacitor and inductor embedded structure and a manufacturing method therefor, and a substrate.

BACKGROUND

With the continuous development of microelectronic technology, users' requirements for miniaturization, multi-function, low power consumption and high reliability of systems are getting higher and higher, and the packaging method of embedding electronic components into a substrate is becoming more and more popular.

At present, multiple electronic components are packaged in different layers inside the substrate in a three-dimensional stacked packaging structure so as to realize the miniaturization and integration of the packaging substrate in the market. However, the three-dimensional stacked packaging technology has many packaging layers and a complicated process, and with the increase of embedded layers, the heat dissipation efficiency will decrease and the costs will increase.

SUMMARY

The disclosure aims to solve at least one of the technical problems in related art to some extent. Therefore, the disclosure proposes a capacitor and inductor embedded structure and a manufacturing method therefor, and a substrate. The following is a summary of the subject matter described in detail herein. The summary is not intended to limit the scope of protection of the claims. The technical solutions are as follows.

In a first aspect, an embodiment of the disclosure provides a manufacturing method for a capacitor and inductor embedded structure, which includes:

providing a metal plate;

sequentially depositing a first protective layer, a thin film dielectric layer, a second protective layer, and an upper electrode layer on an upper surface of the metal plate, and etching the first protective layer, the thin film dielectric layer, the second protective layer, and the upper electrode layer to form a thin film capacitor and a capacitor upper electrode;

pressing an upper dielectric layer to the upper surface of the metal plate, wherein the upper dielectric layer covers the thin film capacitor and the capacitor upper electrode, and etching the metal plate to form a capacitor lower electrode, wherein the capacitor upper electrode, the thin film capacitor and the capacitor lower electrode are sequentially connected to form a capacitor;

pressing a lower dielectric layer to a lower surface of the metal plate, and performing drilling on the upper dielectric layer and the lower dielectric layer to form inductor through holes and capacitor electrode through holes;

electroplating metal to form an inductor and circuit layers, wherein the inductor is arranged in the inductor through holes, and the circuit layers are configured for communicating the inductor with the capacitor electrode through hole; and depositing solder mask layers on the upper and lower surfaces, and photoetching the solder mask layers to form electrode windows of the circuit layers.

The manufacturing method for a capacitor and inductor embedded structure according to the embodiment in the first aspect of the disclosure has at least the following beneficial effects: firstly, in the disclosure, the thin film capacitor and the vertical inductor are embedded in the same horizontal plane, which reduces a space of the capacitor and inductor embedded structure compared with the existing thin film capacitor and inductor laminated structure, thus realizing miniaturization of embedded components; secondly, in the disclosure, the protective layers are respectively added between two capacitor electrodes and the thin film dielectric layer, which can effectively prevent migration of metal ions, thus improving reliability of the thin film dielectric; thirdly, compared with the existing coreless substrate method, the manufacturing method for a capacitor and inductor embedded structure has the advantages of simpler process and lower manufacturing cost.

Optionally, in an embodiment of the disclosure, the manufacturing method for a capacitor and inductor embedded structure further includes performing an oxidation resistance treatment on surfaces of the electrode windows.

Optionally, in an embodiment of the disclosure, the manufacturing method for a capacitor and inductor embedded structure further includes depositing seed layers, wherein the seed layers cover an outer wall of the inductor, upper and lower surfaces of the capacitor, and lower surfaces of the circuit layers.

Optionally, in an embodiment of the disclosure, the capacitor electrode through hole includes an upper electrode through hole and a lower electrode through hole, which are respectively and correspondingly arranged on surfaces of the capacitor upper electrode and the capacitor lower electrode.

Optionally, in an embodiment of the disclosure, the thin film dielectric layer includes aluminium oxide, silicon dioxide, calcium titanate, barium titanate, strontium titanate, silicon nitride, titanium oxide or tantalum oxide compounds with a better dielectric property.

Optionally, in an embodiment of the disclosure, the first protective layer and the second protective layer are made of a metal material, and the first protective layer and the second protective layer both have a thickness greater than or equal to 200 nm.

In a second aspect, an embodiment of the disclosure provides a capacitor and inductor embedded structure, which includes:

a dielectric layer including an upper dielectric layer and a lower dielectric layer, wherein the upper dielectric layer and the lower dielectric layer are respectively provided with an upper electrode through hole and a lower electrode through hole;

a capacitor arranged inside the dielectric layer, wherein the capacitor includes a capacitor upper electrode, a thin film capacitor and a capacitor lower electrode which are sequentially connected from top to bottom, and surfaces of the capacitor upper electrode and the capacitor lower electrode are respectively communicated with the upper electrode through hole and the lower electrode through hole;

an inductor penetrating through the dielectric layer;

circuit layers arranged on upper and lower surfaces of the dielectric layer, and connected with the inductor and the capacitor; and solder mask layers arranged on surfaces of the upper dielectric layer and the lower dielectric layer, and covering the circuit layers, wherein the solder mask layers are provided with electrode windows for leading out electrodes from the circuit layers.

The capacitor and inductor embedded structure according to the embodiment in the second aspect of the disclosure has at least the following beneficial effects: firstly, in the disclosure, the thin film capacitor and the vertical inductor are embedded in the same horizontal plane, which reduces a space of the capacitor and inductor embedded structure compared with the existing thin film capacitor and inductor laminated structure, thus realizing miniaturization of embedded components; secondly, in the disclosure, the protective layers are respectively added between two capacitor electrodes and the thin film dielectric layer, which can effectively prevent migration of metal ions, thus improving reliability of a thin film dielectric; thirdly, compared with the existing coreless substrate method, the manufacturing method for a capacitor and inductor embedded structure has the advantages of simpler process and lower manufacturing cost.

Optionally, in an embodiment of the disclosure, the capacitor and inductor embedded structure further includes a protective film, wherein the protective film is arranged on surfaces of the electrode windows.

Optionally, in an embodiment of the disclosure, the capacitor and inductor embedded structure further includes seed layers arranged on an outer wall of the inductor, upper and lower surfaces of the capacitor, and lower surfaces of the circuit layers.

In a third aspect, an embodiment of the disclosure provides a substrate, which includes the capacitor and inductor embedded structure in the second aspect above.

The substrate according to the embodiment in the third aspect of the disclosure has at least the following beneficial effects: firstly, in the disclosure, the thin film capacitor and the vertical inductor are embedded in the same horizontal plane, which reduces a space of the capacitor and inductor embedded structure compared with the existing thin film capacitor and inductor laminated structure, thus realizing miniaturization of embedded components; secondly, in the disclosure, the protective layers are respectively added between two capacitor electrodes and the thin film dielectric layer, which can effectively prevent migration of metal ions, thus improving reliability of a thin film dielectric; thirdly, compared with the existing coreless substrate method, the manufacturing method for a capacitor and inductor embedded structure has the advantages of simpler process and lower manufacturing cost.

Other features and advantages of the disclosure will be set forth in the following description, and are partially apparent from the description, or are learned by implementing the disclosure. The objects and other advantages of the disclosure may be implemented and obtained by the structure particularly pointed out in the description, the claims and the drawings.

BRIEF DESCRIPTION OF THE DRAWINGS

The drawings are provided to further understand the technical solutions of the disclosure and constitute a part of the specification. The drawings are used together with the embodiments of the disclosure to explain the technical solutions of the disclosure, but are not intended to limit the technical solutions of the disclosure.

Figure 1:
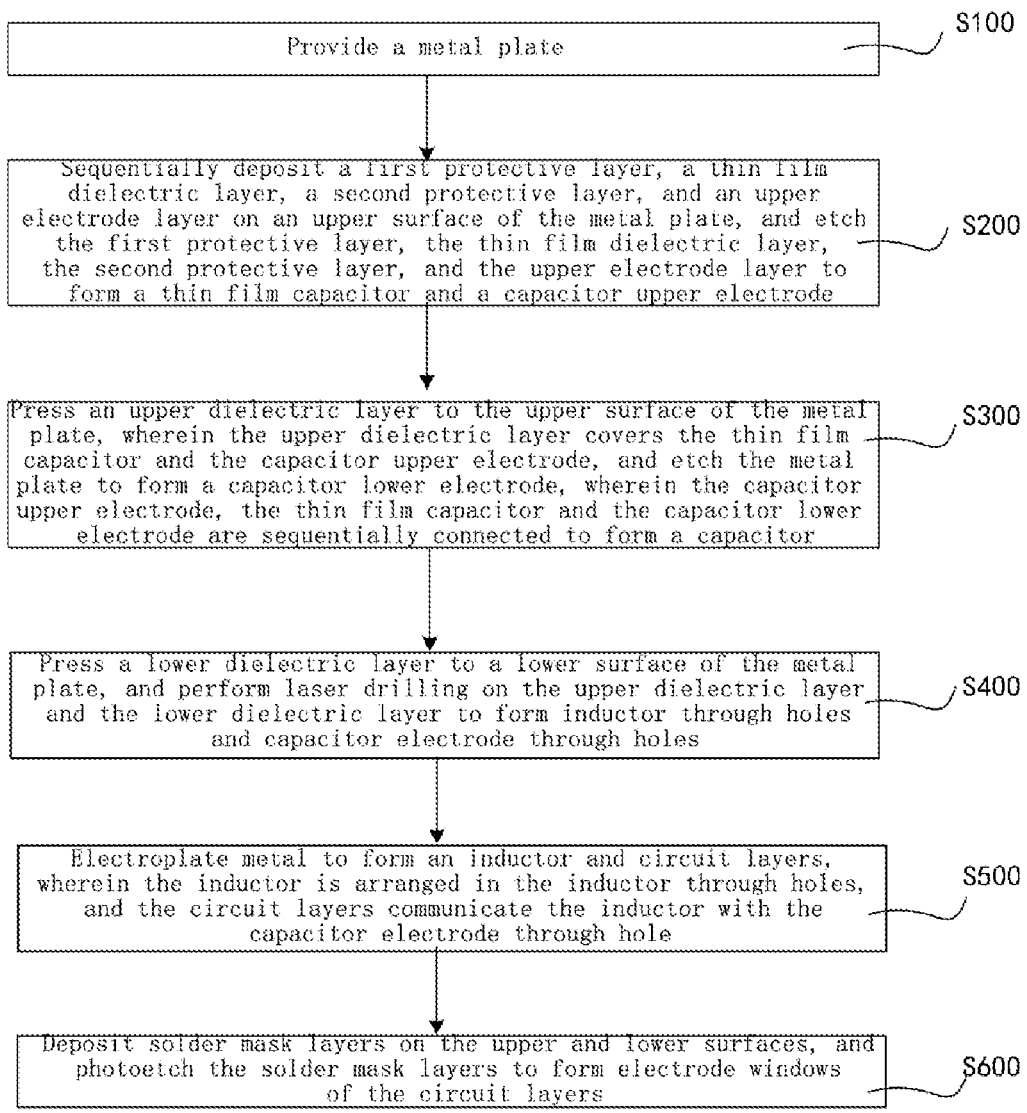
FIG. 1 is a flow chart of steps of a manufacturing method for a capacitor and inductor embedded structure provided by an embodiment of the disclosure.

110 refers to metal plate, 120 refers to first protective layer, 130 refers to thin film dielectric layer, 140 refers to second protective layer, 150 refers to upper electrode seed layer, 160 refers to upper electrode layer, 170 refers to thin film capacitor, 180 refers to capacitor upper electrode, 190 refers to capacitor lower electrode, 100 refers to capacitor, 200 refers to dielectric layer, 210 refers to upper dielectric layer, 220 refers to lower dielectric layer, 230 refers to inductor through hole, 241 refers to upper electrode through hole, 242 refers to lower electrode through hole, 400 refers to inductor, 500 refers to circuit layer, 600 refers to solder mask layer, 610 refers to electrode window, 300 refers to seed layer, 700 refers to protective film, and 800 refers to photosensitive barrier layer.

DETAILED DESCRIPTION

To make the objects, the technical solutions, and the advantages of the disclosure clearer, the disclosure is further described in detail hereinafter with reference to the drawings and the embodiments. It should be understood that the specific embodiments described herein are only used to explain the disclosure, and are not intended to limit the disclosure, thus having no substantive significance in technology. Any structural modification, change of scale relationship, or adjustment of size should still fall within the scope covered by the technical contents disclosed in the disclosure without affecting the effect and the goal achieved by the disclosure.

This part will describe the specific embodiments of the disclosure in detail, and the preferred embodiments of the disclosure are shown in the drawings. The drawings are used to supplement the description of the text in the specification with the graphs, so that people can intuitively and vividly understand each technical feature and the overall technical solution of the disclosure, but the drawings cannot be understood as limiting the scope of protection of the disclosure.

In the description of the disclosure, "several" means one or more, "a plurality of" means two or more, "greater than a number", "less than a number", "exceed a number" and the like indicate that the number is excluded, and "above a number", "below a number", "within a number", and the like indicate that the number is included. "First" and "second" if described are only used to distinguish between technical features but cannot be used to indicate or imply relative importance or implicitly specify a quantity of indicated technical features or implicitly specify a sequential relationship of indicated technical features.

With reference to FIG. 1, an embodiment of the disclosure provides a manufacturing method for a capacitor and inductor embedded structure, which includes the following steps.

Figure 2:
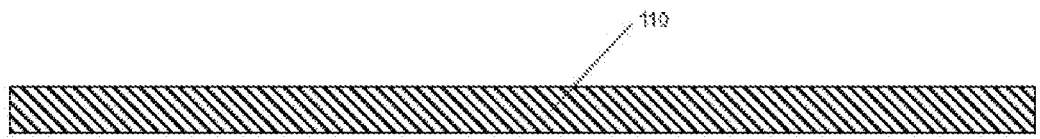
FIG. 2 to FIG. 16 are cross-sectional views of intermediate states of a manufacturing method for a capacitor and inductor embedded structure provided by another embodiment of the disclosure.

In S100, as shown in FIG. 2, a metal plate 110 is provided. Specifically, one metal plate 110 is prepared as an initial layer, the metal plate 110 includes two surfaces in a vertical direction, wherein one of the surfaces is an upper surface and the opposite surface is a lower surface. The metal plate 110 may have a thickness and a size specifically customized according to different requirements. The metal plate 110 may be made of copper, aluminum, copper-aluminum alloy, or other metals or metal alloys. Preferably, the metal plate 110 is made of a copper foil in the disclosure.

Figure 3:
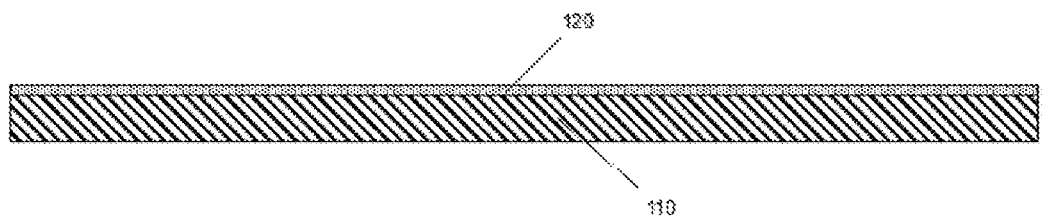
Figure 4:
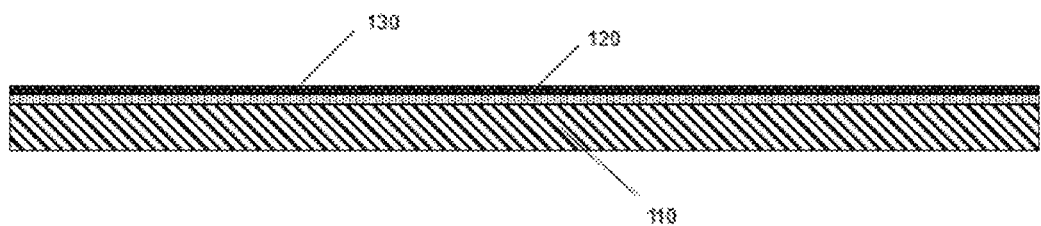
Figure 5:
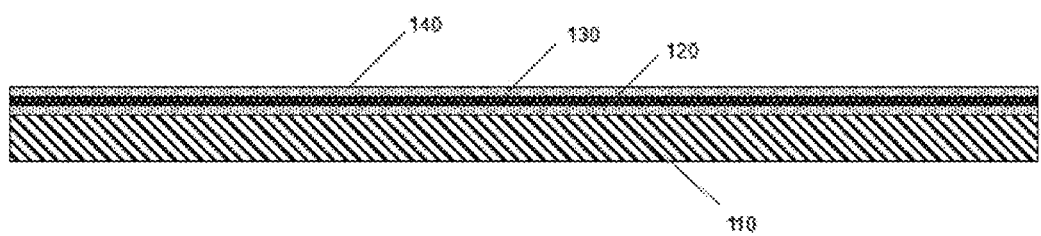
Figure 6:
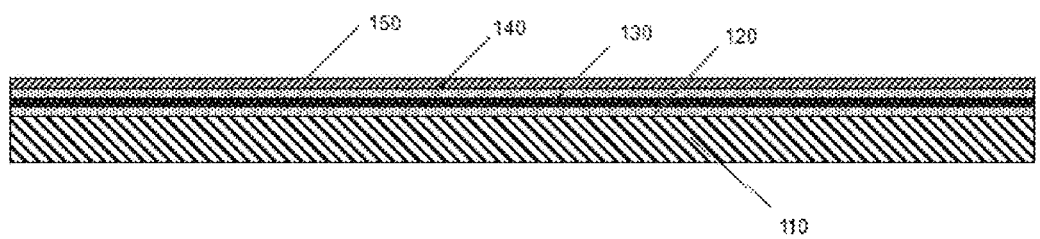
Figure 7:
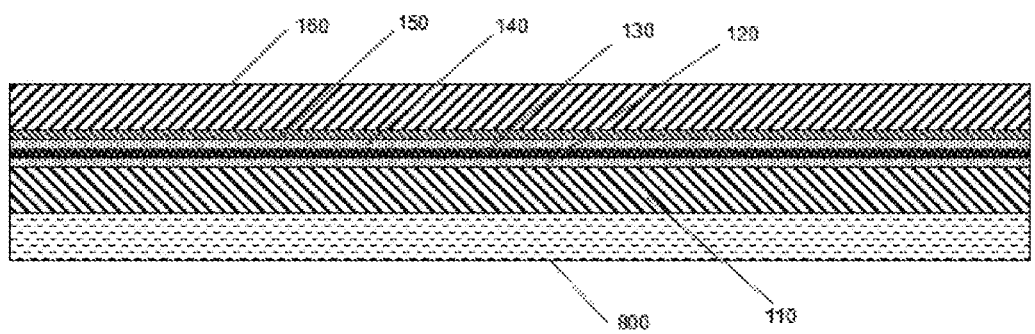
Figure 8:
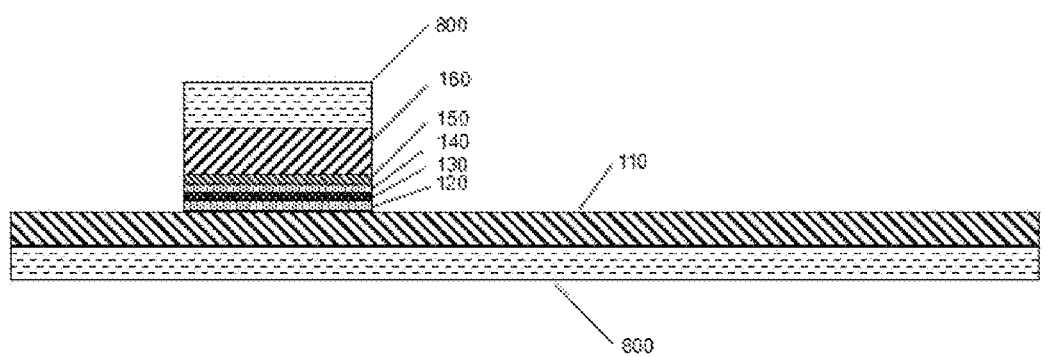
Figure 9:
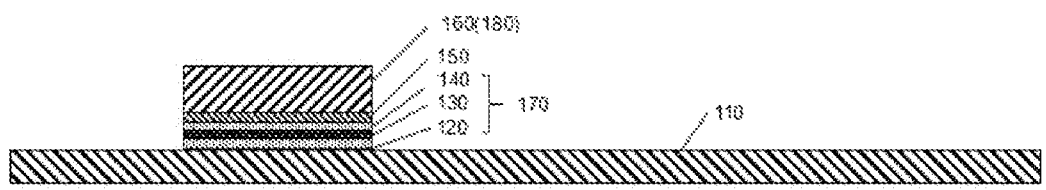

In S200, a first protective layer 120, a thin film dielectric layer 130, a second protective layer 140 and an upper electrode layer 160 are sequentially deposited on an upper surface of the metal plate 110, and the first protective layer 120, the thin film dielectric layer 130, the second protective layer 140 and the upper electrode layer 160 are etched to form a thin film capacitor 170 and a capacitor upper electrode 180. Specifically, as shown in FIG. 3, the first protective layer 120 is deposited on an upper surface of the copper foil, and the first protective layer 120 is made of a metal material, which is specifically matched with a material of the thin film dielectric layer 130 in subsequent process. In an embodiment of the disclosure, metal tantalum (Ta) is preferably selected as the material of the first protective layer 120, with a deposition thickness controllable according to a design requirement. In an embodiment of the disclosure, the first protective layer may exert a very good protective effect when the thickness of the first protective layer 120 is greater than or equal to 200 nm. It should be noted that the first protective layer 120 is configured for isolating the copper foil from a thin film dielectric in subsequent steps to prevent migration of copper ions. As shown in FIG. 4, the thin film dielectric layer 130 is continuously deposited on a surface of the deposited first protective layer 120, and the material of the thin film dielectric layer 130 may be selected from one or more of compounds with excellent dielectric property such as aluminium oxide, silicon dioxide, calcium titanate, barium titanate, strontium titanate, silicon nitride, titanium oxide and tantalum oxide. Preferably, in an embodiment of the disclosure, the thin film dielectric layer 130 is made of tantalum oxide ($Ta_2O_5$), which is matched with the tantalum (Ta) of the first protective layer 120, and a thickness of the tantalum oxide ($Ta_2O_5$) may be defined according to a capacitive-resistance requirement for actual design. Preferably, in an embodiment of the disclosure, the thickness of the tantalum oxide ($Ta_2O_5$) is set to about 1 μm. It should be noted that the isolation of the first protective layer 120 may prevent ion migration of the copper foil with the thin film dielectric, thus ensuring the dielectric property of the dielectric. As shown in FIG. 5, further, the second protective layer 140 is successively deposited on a surface of the deposited tantalum oxide layer. In an embodiment of the disclosure, similar to the first protective layer 120, the thickness of the second protective layer 140 is required to be greater than or equal to 200 nm. As shown in FIG. 6, an upper electrode seed layer 150 is deposited on an upper surface of the second protective layer 140, the upper electrode seed layer 150 may provide a good growth environment for deposition of the upper electrode layer 160 in the next step, so that the upper electrode layer 160 has a better deposition quality, and the upper electrode seed layer 150 is made of a metal or metal alloy material. In an embodiment of the disclosure, preferably, the upper electrode seed layer 150 is made of copper. It should be noted that the first protective layer 120, the thin film dielectric layer 130, the second protective layer 140 and the upper electrode seed layer 150 may be deposited by means of physical sputtering or chemical vapor deposition, which is not limited in the disclosure. As shown in FIG. 7, a photosensitive barrier layer 800 is attached to a lower surface of the copper foil of the starting metal plate 110 to protect and shield the lower surface, and the upper electrode layer 160 is electroplated on an upper surface of the upper electrode seed layer 150 by chemical electroplating, with an electroplating thickness defined according to an actual requirement. As shown in FIG. 8, the photosensitive barrier layer 800 is attached to a surface of the upper electrode layer 160 and patterning is performed to shield a terminal position of the capacitor upper electrode 180 and expose other positions, and ion etching is successively performed on unshielded areas of the first protective layer 120, the thin film dielectric layer 130, the second protective layer 140, the upper electrode seed layer 150 and the upper electrode layer 160 to form the capacitor upper electrode 180 and the thin film capacitor 170. As shown in FIG. 9, the photosensitive barrier layers 800 attached to the upper and lower surfaces are removed.

It should be noted that the photosensitive barrier layer 800 is made of a photoresist, the photoresist includes a photosensitive dry film or a liquid photoresist, and a PCB photoresist, also referred to as photoresist, may be changed into an etching-resistant film material after being illuminated or irradiated by ultraviolet light, deep ultraviolet light, electron beam, ion beam, X-ray, etc., thus protecting and shielding the underneath layers. In some embodiments of the disclosure, the photosensitive barrier layer 800 is preferably adopted, but it is not limited to the photosensitive barrier layer 800.

Figure 10:
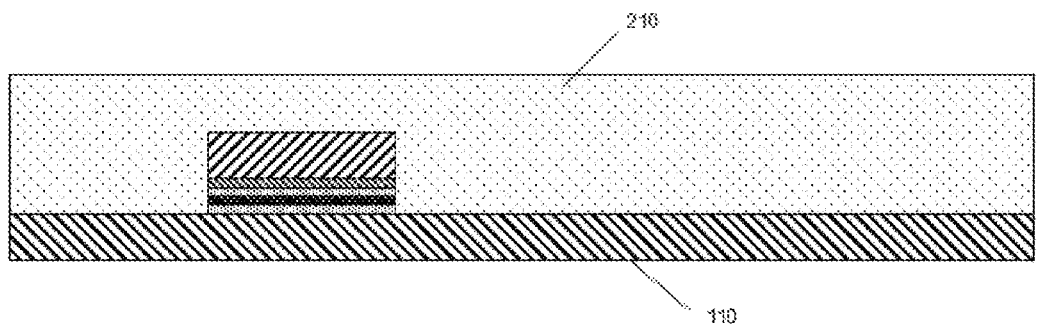
Figure 11:
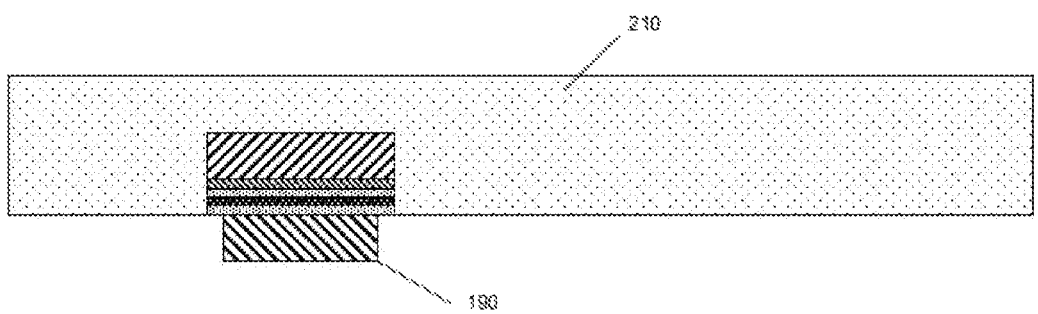

In S300, an upper dielectric layer 210 is pressed to the upper surface of the metal plate 110, wherein the upper dielectric layer 210 covers the thin film capacitor 170 and the capacitor upper electrode 180, and the metal plate 110 is etched to form a capacitor lower electrode 190, wherein the capacitor upper electrode 180, the thin film capacitor 170 and the capacitor lower electrode 190 are sequentially connected to form a capacitor 100. Specifically, as shown in FIG. 10, the upper dielectric layer 210 is pressed to cover the capacitor upper electrode 180, and the upper dielectric layer 210 is usually made of a resin material. As shown in FIG. 11, the photosensitive barrier layer 800 is re-attached to the lower surface of the metal plate 110 and a protective pattern is formed by photoetching to shield a terminal position of the capacitor lower electrode 190 and expose other areas, ion etching is performed on the metal plate 110 to form the capacitor lower electrode 190, and then the photosensitive barrier layer 800 is removed.

Figure 12:
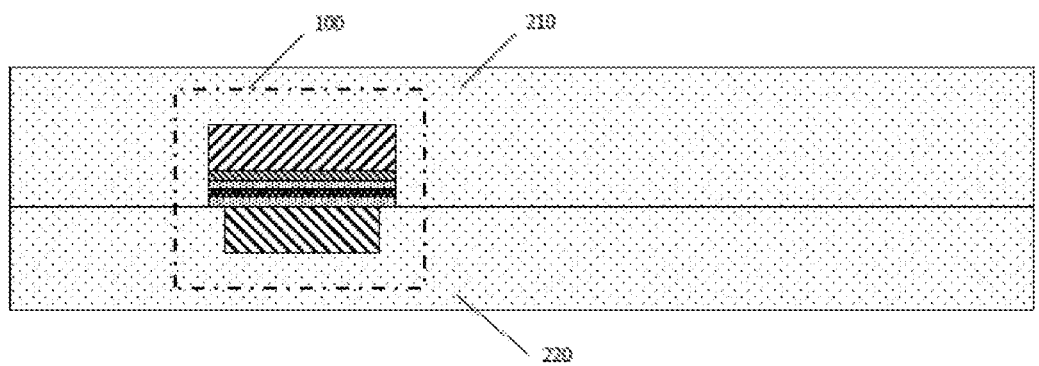
Figure 13:
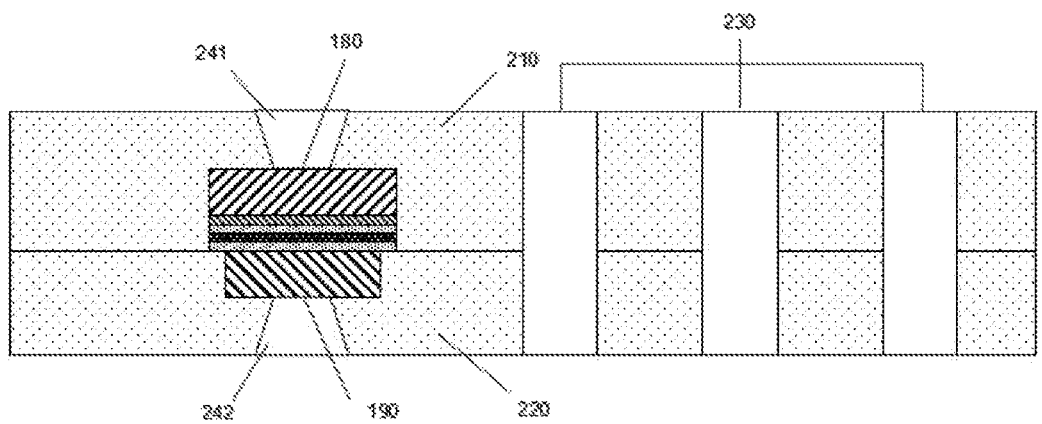

In S400, a lower dielectric layer 220 is pressed to the lower surface of the metal plate 110, and laser drilling is performed on the upper dielectric layer 210 and the lower dielectric layer 220 to form inductor through holes 230 and capacitor 100 electrode through holes. Specifically, as shown in FIG. 12, the lower dielectric layer 220 is pressed to cover the capacitor lower electrode 190, and the dielectric layer 200 is usually made of a resin material. As shown in the FIG. 13, the upper dielectric layer 210 and the lower dielectric layer 220 are respectively opened with a window by laser drilling at positions corresponding to the capacitor upper electrode 180 and the capacitor lower electrode 190 to form an upper electrode through hole 241 and a lower electrode through hole 242, and the upper dielectric layer 210 and the lower dielectric layer 220 are drilled through by laser drilling in a vertical direction to form the inductor through holes 230. It should be noted that the capacitor upper electrode 180 and the capacitor lower electrode 190 can effectively protect the thin film dielectric layer 130, thus avoiding a damage caused by the laser drilling.

Figure 14:
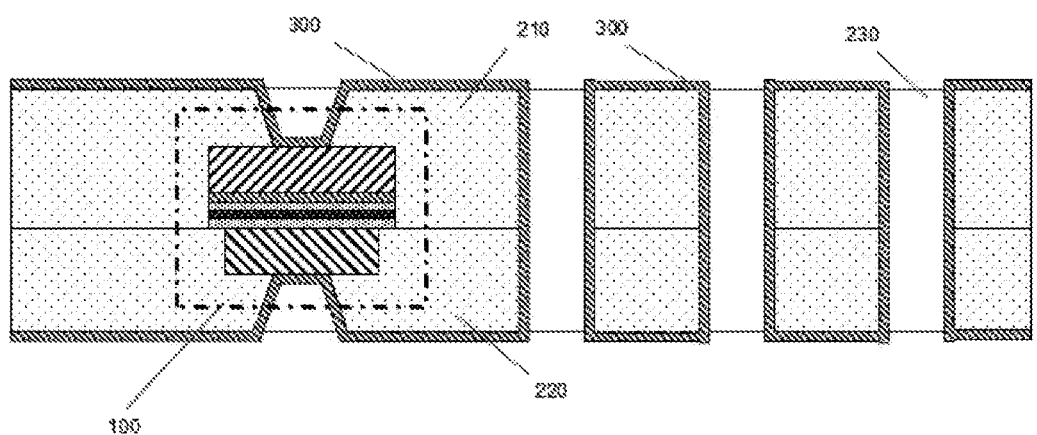
Figure 15:
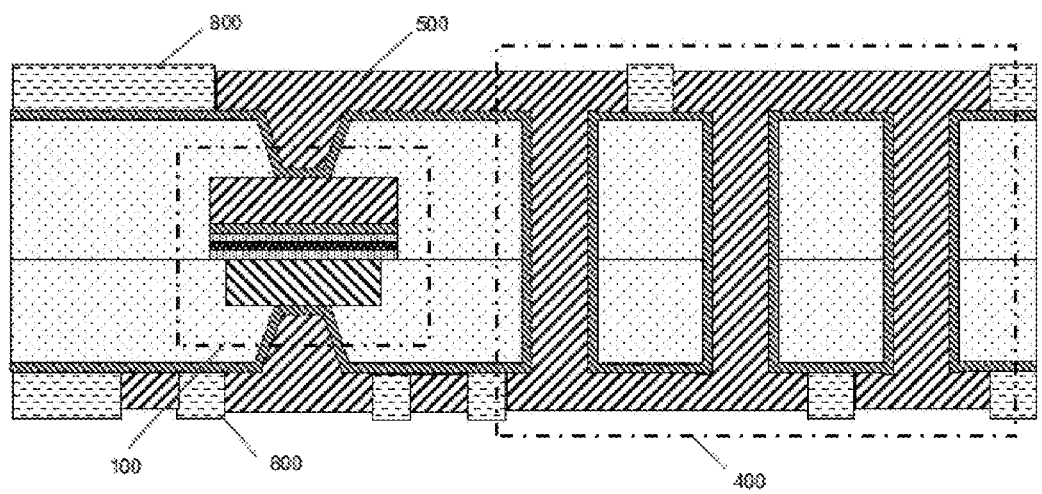
Figure 16:
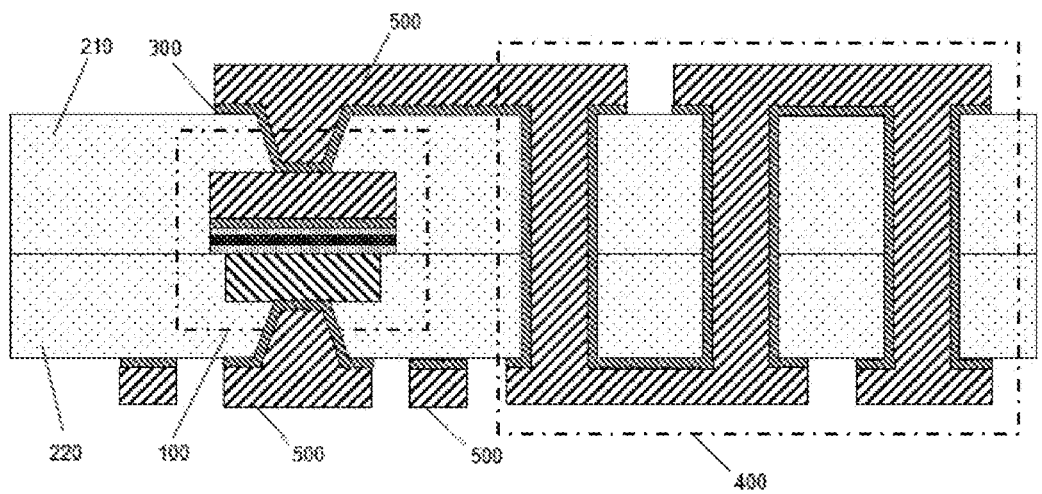

In S500, metal is electroplated to form an inductor 400 and circuit layers 500, wherein the inductor 400 is arranged in the inductor through holes 230, and the circuit layers 500 are configured for communicating the inductor 400 with the capacitor 100. Specifically, as shown in FIG. 14, seed layers 300 are deposited on surfaces of the upper dielectric layer 210 and the lower dielectric layer 220 respectively by physical sputtering, so that the seed layers 300 cover the upper and lower surfaces and walls of all through holes, including the upper electrode through hole 241, the lower electrode through hole 242 and the inductor through holes 230. The seed layers 300 can make the circuit layers 500 in better contact with the dielectric layer 200, thus improving the reliability of products. As shown in FIG. 15, the photosensitive barrier layers 800 are attached to the upper and lower surfaces of the structure shown in FIG. 14 respectively and patterning is performed to expose areas to be electroplated, wherein the areas to be electroplated include the upper electrode through hole 241, the lower electrode through hole 242, the inductor through holes 230 and the circuit layers 500 for electrical connection, and metal is electroplated in the areas to be electroplated to form the inductor 400 and the circuit layer 500. The circuit layers 500 are located on upper and lower surfaces of the dielectric layer 200, the capacitor upper electrode 180 is communicated with one end of the inductor 400 through the circuit layer 500 on the upper surface, and the circuit layer 500 on the lower surface includes two parts, wherein one part is connected with the capacitor lower electrode 190, and the other part is connected with the other end of the inductor 400. Same layer series connection between the inductor 400 and the capacitor 100 can be realized by connecting the circuit layers 500 on the upper and lower surfaces, and an electroplating thickness of the circuit layers 500 may be controlled according to design requirement. As shown in FIG. 16, the photosensitive barrier layers 800 on the upper and lower surfaces are removed, the seed layers 300 are etched, so that the seed layers 300 are consistent with openings of the circuit layers 500, and finally a loop is formed by connecting the thin film capacitor 170 and the vertical inductor 400 in series.

Figure 17:
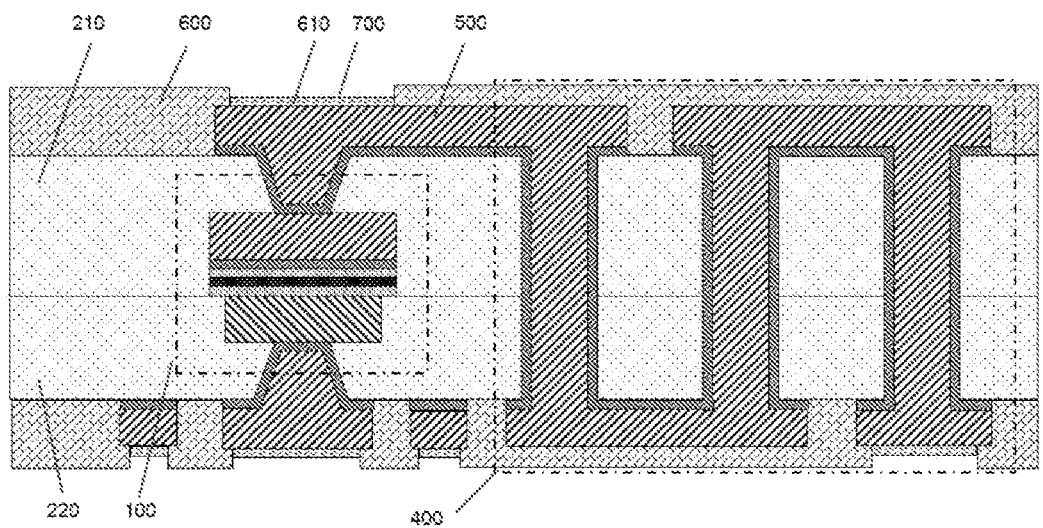
FIG. 17 is a cross-sectional view of a capacitor and inductor embedded structure provided by another embodiment of the disclosure.

In S600, solder mask layers 600 are deposited on the upper and lower surfaces, and the solder mask layers 600 are photoetched to form electrode windows 610 of the circuit layers 500. Specifically, as shown in FIG. 17, the solder mask layers 600 are deposited on the upper and lower surfaces of the structure shown in FIG. 16, and the solder mask layers 600 are photoetched to expose the electrode windows 610 of the circuit layers 500. The electrode window 610 of the circuit layer 500 is configured for leading out electrical properties of the embedded capacitor 100 and inductor 400, thus being convenient for connecting with an external circuit, and finally an oxidation resistance treatment is performed on surface of the electrode windows 610 to form a protective film 700. Specifically, a rare metal protective layer is formed on the surface of the electrode window 610, wherein rare metal has the characteristics of stable chemical property and corrosion resistance, which can prevent oxidation of the electrode window 610. Forming of the protective film 700 include an Electroless Nickel Electroless Palladium Immersion Gold (ENEPIG) technology and an Organic Solderability Preservatives (OSP) technology.

Based on the manufacturing method for a capacitor and inductor embedded structure above, various embodiments of the capacitor and inductor embedded structure of the disclosure are proposed.

With reference to FIG. 9 to FIG. 17, another embodiment of the disclosure further provides a capacitor and inductor embedded structure, which includes a dielectric layer 200 including an upper dielectric layer 210 and a lower dielectric layer 220, wherein the upper dielectric layer 210 and the lower dielectric layer 220 are respectively provided with an upper electrode through hole 241 and a lower electrode through hole 242; a capacitor 100 arranged inside the dielectric layer 200, wherein the capacitor 100 includes a capacitor upper electrode 180, a thin film capacitor 170 and a capacitor lower electrode 190 which are sequentially connected from top to bottom, and surfaces of the capacitor upper electrode 180 and the capacitor lower electrode 190 are respectively communicated with the upper electrode through hole 241 and the lower electrode through hole 242; an inductor 400 penetrating through the dielectric layer 200; circuit layers 500 arranged on upper and lower surfaces of the dielectric layer 200, and connected with the inductor 400 and the capacitor 100; and solder mask layers 600 arranged on surfaces of the upper dielectric layer 210 and the lower dielectric layer 220, and covering the circuit layers 500, wherein the solder mask layers 600 are provided with electrode windows 610 for leading out electrodes from the circuit layers 500.

In an embodiment, the inductor 400 and the capacitor 100 are embedded inside the dielectric layer 200, and the dielectric layer 200 includes the upper dielectric layer 210 and the lower dielectric layer 220. The upper dielectric layer 210 and the lower dielectric layer are respectively provided with the upper electrode through hole 241 and the lower electrode through hole 242 connected with the capacitor upper electrode 180 and the capacitor lower electrode 190, the surfaces of the upper electrode through hole 241 and the lower electrode through hole 242 are filled with metal, and the metal is communicated with the circuit layers 500 integrally. The circuit layers 500 are arranged on the upper and lower surfaces of the dielectric layer 200, the capacitor upper electrode 180 is connected with one end of the inductor 400 through the circuit layer 500 on the upper surface, and the circuit layer 500 on the lower surface includes two parts, wherein one part is connected with the capacitor lower electrode 190 and the other part is connected with the other end of the inductor 400. A same layer series connection loop of the inductor 400 and the capacitor 100 can be realized by connecting the circuit layers 500 on the upper and lower surfaces. The solder mask layers 600 cover the surfaces of the circuit layers 500 for isolating the internal inductor 400 and capacitor 100 from an external circuit, the solder mask layers 600 are provided with the electrode windows 610 of the circuit layers, and electrical interfaces of the internal inductor 400 and capacitor 100 are led out through the electrode windows 610, so as to realize connection with the external circuit.

The capacitor and inductor embedded structure provided by the embodiment of the disclosure further includes a protective film 700, wherein the protective film 700 is arranged on surfaces of the electrode windows 610.

In an embodiment, a rare metal protective layer is arranged on the surface of the electrode window 610, wherein rare metal has the characteristics of stable chemical property and corrosion resistance, which can prevent oxidation of the electrode window 610. Forming of the protective film 700 include an Electroless Nickel Electroless Palladium Immersion Gold (ENEPIG) technology and an Organic Solderability Preservatives (OSP) technology.

The capacitor and inductor embedded structure provided by the embodiment of the disclosure further includes seed layers 300 arranged on an outer wall of the inductor 400, the upper and lower surfaces of the capacitor 100 and the lower surface of the circuit layers 500, and the seed layers 300 can make the circuit layers 500 in better contact with the dielectric layer 200, thus improving a reliability of products.

Another embodiment of the disclosure further provides a substrate, wherein the substrate includes the capacitor and inductor embedded structure in any one of the embodiments above.

The foregoing describes the preferred embodiments of the disclosure in detail, but the disclosure is not limited to the above embodiments. Those skilled in the art may further make various equivalent modifications or substitutions without violating the gist of the disclosure, and these equivalent modifications or substitutions are included in the scope defined by the claims of the disclosure.

The invention claimed is:

1. A manufacturing method for a capacitor and inductor embedded structure, comprising:
    providing a metal plate;
    sequentially depositing a first protective layer, a thin film dielectric layer, a second protective layer, and an upper electrode layer on an upper surface of the metal plate, and etching the first protective layer, the thin film dielectric layer, the second protective layer, and the upper electrode layer to form a thin film capacitor and a capacitor upper electrode;
    pressing an upper dielectric layer to the upper surface of the metal plate, wherein the upper dielectric layer covers the thin film capacitor and the capacitor upper electrode, and etching the metal plate to form a capacitor lower electrode, wherein the capacitor upper electrode, the thin film capacitor and the capacitor lower electrode are sequentially connected to form a capacitor;
    pressing a lower dielectric layer to a lower surface of the metal plate, and performing drilling on the upper dielectric layer and the lower dielectric layer to form inductor through holes and capacitor electrode through holes;
    electroplating metal to form an inductor and circuit layers, wherein the inductor is arranged in the inductor through holes, and the circuit layers are configured for communicating the inductor with the capacitor; and
    depositing solder mask layers on the upper and lower surfaces, and photoetching the solder mask layers to form electrode windows of the circuit layers.

2. The manufacturing method for a capacitor and inductor embedded structure according to claim 1, further comprising performing an oxidation resistance treatment on surfaces of the electrode windows to form a protective film.

3. The manufacturing method for a capacitor and inductor embedded structure according to claim 1, further comprising depositing seed layers, wherein the seed layers cover an outer wall of the inductor, upper and lower surfaces of the capacitor, and lower surfaces of the circuit layers.

4. The manufacturing method for a capacitor and inductor embedded structure according to claim 1, wherein the capacitor electrode through hole comprises an upper electrode through hole and a lower electrode through hole, which are respectively and correspondingly arranged on surfaces of the capacitor upper electrode and the capacitor lower electrode.

5. The manufacturing method for a capacitor and inductor embedded structure according to claim 1, wherein the thin film dielectric layer comprises aluminium oxide, silicon dioxide, calcium titanate, barium titanate, strontium titanate, silicon nitride, titanium oxide or tantalum oxide compounds with a better dielectric property.

6. The manufacturing method for a capacitor and inductor embedded structure according to claim 1, wherein the first protective layer and the second protective layer are made of a metal material, and the first protective layer and the second protective layer both have a thickness greater than or equal to 200 nm.

7. A capacitor and inductor embedded structure, comprising:
    a dielectric layer comprising an upper dielectric layer and a lower dielectric layer, wherein the upper dielectric layer and the lower dielectric layer are respectively provided with an upper electrode through hole and a lower electrode through hole;
    a capacitor arranged inside the dielectric layer, wherein the capacitor comprises a capacitor upper electrode, a thin film capacitor and a capacitor lower electrode which are sequentially connected from top to bottom, and surfaces of the capacitor upper electrode and the capacitor lower electrode are respectively communicated with the upper electrode through hole and the lower electrode through hole;
    an inductor penetrating through the dielectric layer;
    circuit layers arranged on upper and lower surfaces of the dielectric layer, and connected with the inductor and the capacitor; and
    solder mask layers arranged on surfaces of the upper dielectric layer and the lower dielectric layer, and covering the circuit layers, wherein the solder mask layers are provided with electrode windows for leading out electrodes from the circuit layers.

8. The capacitor and inductor embedded structure according to claim 7, further comprising a protective film, wherein the protective film is arranged on surfaces of the electrode windows.

9. The capacitor and inductor embedded structure according to claim 7, further comprising seed layers arranged on an outer wall of the inductor, upper and lower surfaces of the capacitor, and lower surfaces of the circuit layers.

10. A substrate, comprising a capacitor and inductor embedded structure comprising:
    a dielectric layer comprising an upper dielectric layer and a lower dielectric layer, wherein the upper dielectric layer and the lower dielectric layer are respectively provided with an upper electrode through hole and a lower electrode through hole;
    a capacitor arranged inside the dielectric layer, wherein the capacitor comprises a capacitor upper electrode, a thin film capacitor and a capacitor lower electrode which are sequentially connected from top to bottom, and surface of the capacitor upper electrode and the capacitor lower electrode are respectively communicated with the upper electrode through hole and the lower electrode through hole;
    an inductor penetrating through the dielectric layer;
    circuit layers arranged on upper and lower surfaces of the dielectric layer, and connected with the inductor and the capacitor; and
    solder mask layers arranged on surfaces of the upper dielectric layer and the lower dielectric layer, and covering the circuit layers, wherein the solder mask layers are provided with electrode windows for leading out electrodes from the circuit layers.

11. The substrate according to claim 7, wherein the capacitor and inductor embedded structure further comprises a protective film arranged on surfaces of the electrode windows.

12. The substrate according to claim 7, wherein the capacitor and inductor embedded structure further comprises seed layers arranged on an outer wall of the inductor, upper and lower surfaces of the capacitor, and lower surfaces of the circuit layers.

* * * * *